(12) United States Patent
Lin et al.

(10) Patent No.: US 8,283,777 B2
(45) Date of Patent: Oct. 9, 2012

(54) COMPRESSIVE RING STRUCTURE FOR FLIP CHIP PACKAGING

(75) Inventors: Po-Yao Lin, Zhudong Township (TW); Wen-Yi Lin, Wugu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 195 days.

(21) Appl. No.: 12/718,550

(22) Filed: Mar. 5, 2010

(65) Prior Publication Data

US 2011/0215463 A1 Sep. 8, 2011

(51) Int. Cl.
*H01L 23/12* (2006.01)

(52) U.S. Cl. . 257/718; 257/726; 257/727; 257/E23.083; 257/E23.086; 361/820

(58) Field of Classification Search ............... 257/718, 257/726, 727, E23.083, E23.086; 361/513, 361/769, 787, 820

See application file for complete search history.

(56) References Cited

U.S. PATENT DOCUMENTS

| 6,191,480 | B1 * | 2/2001 | Kastberg et al. ............... 257/727 |
| 6,949,404 | B1 | 9/2005 | Fritz et al. |
| 7,459,782 | B1 | 12/2008 | Li |

* cited by examiner

*Primary Examiner* — Jasmine Clark
(74) *Attorney, Agent, or Firm* — Lowe Hauptman Ham & Berner, LLP

(57) ABSTRACT

Flip chip packages having warpage control and methods for fabricating such packages are described. In one embodiment, the flip chip package comprises a package substrate; a chip coupled to the package substrate; and a ring structure coupled to the package substrate and positioned laterally around the periphery of the chip so that a surface of the chip is exposed, wherein the ring structure comprises one or more compressive members, each of the one or more compressive members compressively opposed to a surface of the package substrate to counter or absorb stresses in the package substrate.

20 Claims, 4 Drawing Sheets

US 8,283,777 B2

COMPRESSIVE RING STRUCTURE FOR FLIP CHIP PACKAGING

BACKGROUND

The disclosure relates generally to semiconductor device package assembly, and more particularly to a ring structure for flip chip packaging.

In the microelectronics industry, a chip carrying an integrated circuit is commonly mounted on a package carrier, such as a substrate, a circuit board or a leadframe that provides electrical connections from the chip to the exterior of the package. In one such packaging arrangement called flip chip mounting, the chip includes an area array of electrically conductive contacts, known as bond pads that are electrically connected to corresponding area array of electrically-conductive contacts on the substrate known as solder bumps. Typically, the solder bumps are registered with the bond pads and a reflow process is applied to create electrical connections in the form of solder joints between the chip and the substrate. The process of flip chip mounting results in a space or gap between the chip and the substrate.

The chip and the substrate are usually formed of different materials having mismatched coefficients of thermal expansion (CTE). As a result, the chip and the substrate experience significantly different dimensional changes when heated that creates significant thermally induced stresses in the electrical connections between the chip and the substrate. If uncompensated, the disparity in thermal expansion can result in degradation in the performance of the chip, damage to the solder joints, or package failure. As the size of the chip increases, the effect of a mismatch in the coefficient of thermal expansion between the chip and the substrate becomes more pronounced. In stacked die packages, the mismatch in coefficient of thermal expansion between the die laminate and the package may be even greater than in single die packages. The failure mechanism in stacked die packages may shift from solder joint damage to die damage.

To improve the reliability of electrical connections in flip chip package assemblies, it is common in the microelectronics industry to fill the gap between the chip and the substrate with an encapsulant material, or underfill. The underfill increases the fatigue life of the package and improves the reliability of the electrical connections by reducing the stress experienced by the electrical connections during thermal cycling (e.g., changes in temperature) or when the chip and the substrate have a significant temperature differential.

To further enhance the rigidity of the package assembly, stiffeners are often employed in the package assembly. A stiffener (also sometimes referred to as a "picture frame") is a rigid ring-like structure made from a material such as metal having substantially the same dimensions as the package substrate with a window in its center to clear the chip. The stiffener attaches on the substrate and surrounds the chip to constrain the substrate in order to prevent its warpage or other movement relative to the chip, which may be caused by thermal cycling during package assembly, reliability testing, or field operation. Even with the use of the stiffener in the flip chip package, however the package may still suffer warpage to some degree. Moreover, as it is the natural tendency of the substrate to warp during thermal cycling, testing or operation, sometimes into a convex shape, with the attachment of the stiffener to the substrate stress may be imposed on the substrate as it is being constrained by the stiffener. The warpage and stress in the chip or package may lead to chip performance degradation or package failure.

For these reasons and other reasons that will become apparent upon reading the following detailed description, there is a need for an improved flip chip package that overcomes the problems discussed above.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present invention. However, one having an ordinary skill in the art will recognize that embodiments of the invention can be practiced without these specific details. In some instances, well-known structures and processes have not been described in detail to avoid unnecessarily obscuring embodiments of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
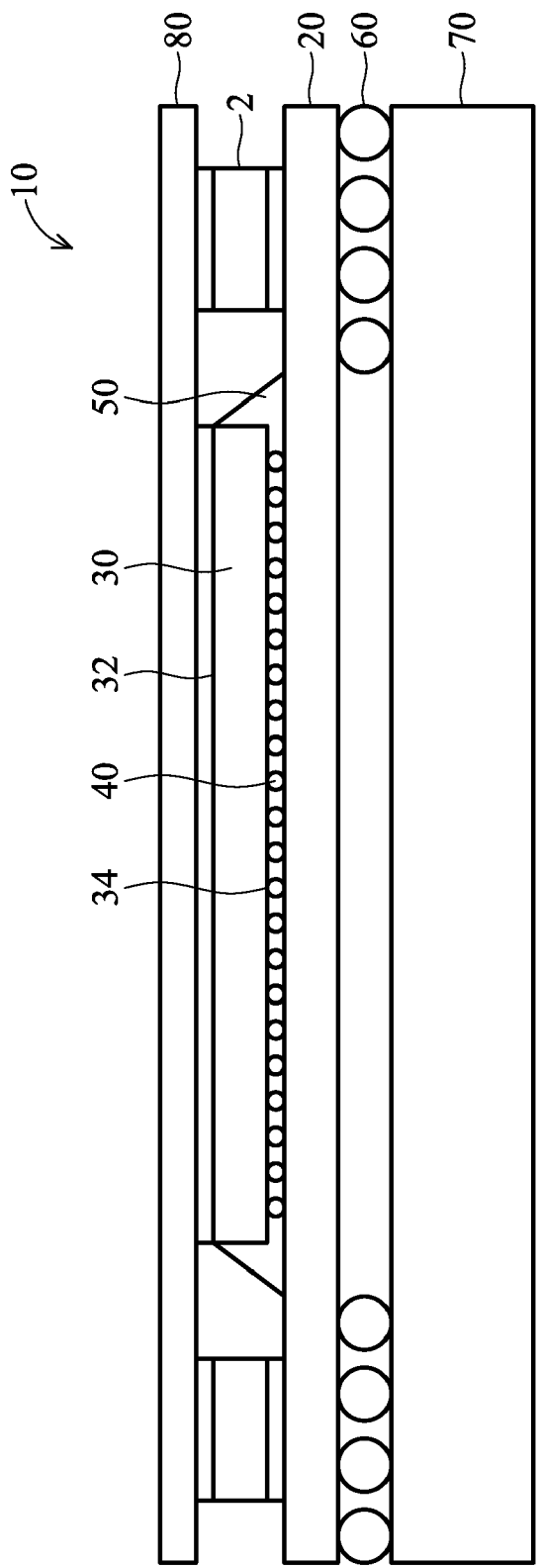
FIG. 1 is a cross-sectional view of a conventional semi-completed flip chip package showing a stiffener mounted to a substrate.

FIG. 1 is a cross-sectional view of a conventional semi-finished flip chip package 10 showing a stiffener 2 mounted to a substrate 20. Flip chip package 10 includes a chip 30 having an upper surface 32 and a lower surface 34 opposite the upper surface 32. A set of solder bumps 40 is connected to contact pads (not shown) on the lower surface 34 of chip 30. Chip 30 is secured to a first substrate 20 underlying chip 30. Solder bumps 40 are attached to contact pads (not shown) on an upper surface of first substrate 20. An underfill 50 is filled between chip 30 and first substrate 20 to stiffen the flip chip package 10 and further protect chip 30 from flexural damage. A set of solder balls 60 is secured to contact pads (not shown) on a second substrate 70. The second substrate 70 may be a printed circuit board or a multilayer module.

The flip chip package 10 also includes a stiffener 2 and a heat spreader 80 for preventing excess warpage of the package. Stiffener 2 is typically a flat structure having substantially the same dimensions as the first substrate 20 and has an opening therein to expose chip 30. One purpose of stiffener 2 is to constrain the first substrate 20 in order to prevent its warpage or other movement relative to chip 30, which may be caused by thermal cycling during package assembly, reliability testing, or field operation. Such movement may result from the different coefficients of thermal expansion (CTE) of the chip 30 and substrate materials. However, as noted above even with the use of stiffener 2 in package 10, package 10 may still suffer warpage to some degree. Due to the different coefficients of thermal expansion of the die and substrate materials, the substrate tends to warp, the substrate typically bowing into a convex shape. Stiffener 2 may reduce to some extent this warpage but since stiffener 2 constrains the substrate this constraining force produces stress in the chip 30 or the flip chip package 10 causing electrical or mechanical failures.

Figure 2:
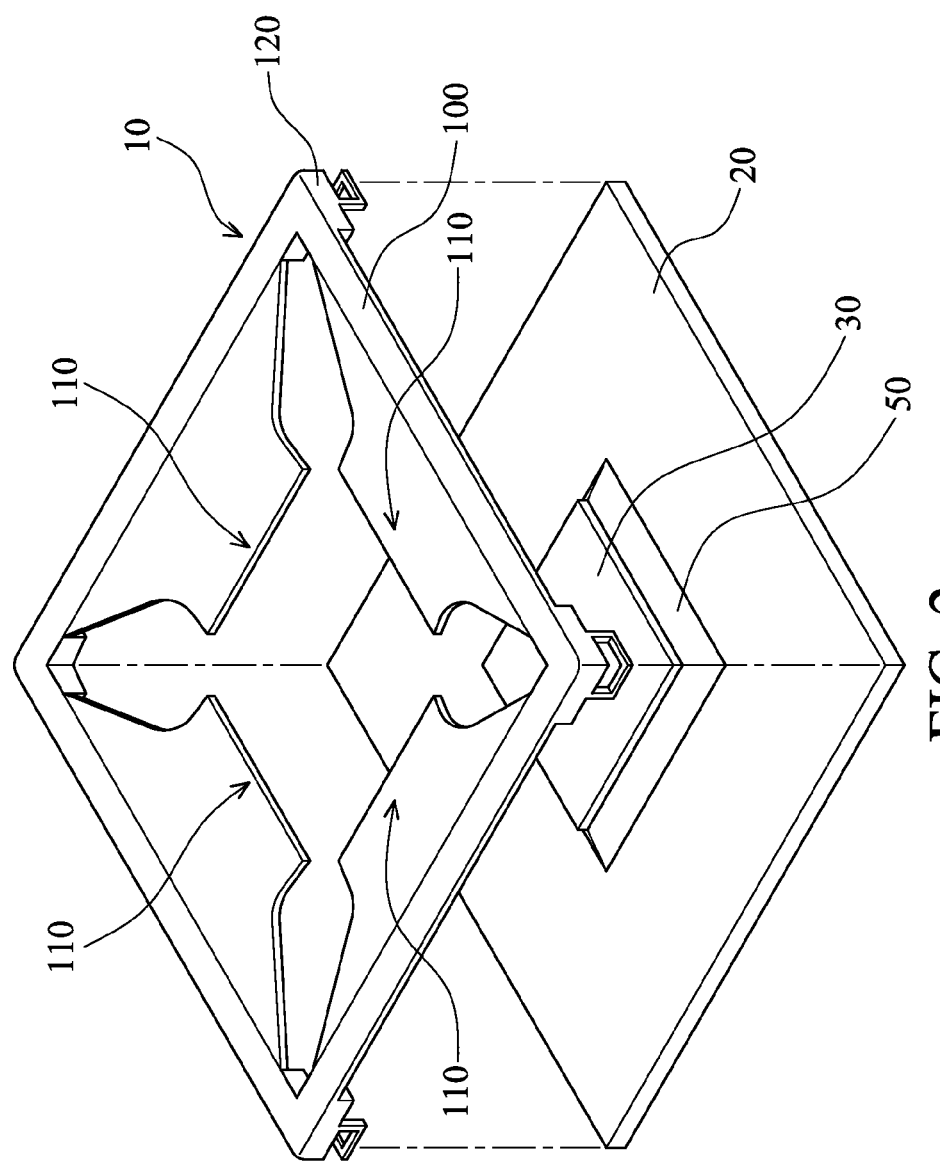
FIG. 2 is a perspective view of a ring structure for chip packaging, according to one embodiment of the present invention.

What is needed is a flip chip package having a constraint structure that improves the redistribution of mechanical or thermal stress, caused from the CTE mismatches within the chip and package, away from the weaker parts to the stronger parts of the chip or package. FIG. 2 is a perspective view of a flip chip package 10 having a ring structure 100 for chip packaging, according to one embodiment of the present invention. Embodiments of the ring structure 100 absorb and/or redistribute forces generated by the CTE mismatches in the package 10. Flip chip package 10 includes a substrate 20 and a chip 30 mounted to the substrate 20. An underfill 50 is shown filled between chip 30 and substrate 20 to enhance the mechanical bonding of the chip 30 and the substrate 20.

Ring structure 100 is coupled to the substrate 20 and positioned laterally around the periphery of the chip 30. Ring structure 100 is typically a flat piece of structure having substantially the same dimensions as substrate 20 with a window in its center to clear the chip 30. The clearance in the ring structure 100 allows for the use of a heat transferer, such as a heat sink for mounting atop chip 30 to draw heat away from chip 30 during operation. The dimensions of the ring structure 100 are largely determined by the size of the flip chip package 10 and are dependent on at least the size and shape of substrate 20. Ring structure 100 is formed of a rigid yet flexible material. In one exemplary embodiment, ring structure 100 comprises a metal such as copper, aluminum, or copper tungsten. In another embodiment, ring structure 100 comprises a ceramic material. In yet another embodiment, ring structure 100 comprises a silicon containing material. In yet another embodiment, ring structure 100 comprises a composite alloy. In yet another embodiment, ring structure 100 comprises a plastic material. According to an aspect of the present invention, the ring structure material is typically selected to have a CTE the same as or sufficiently similar to the substrate 20 in order to apply a counter force to the substrate 20 and reduce the bow of the flip chip package 10 to within tolerances accepted in the industry.

Still referring to FIG. 2, ring structure 100 includes one or more compressive members 110 integral to ring structure 100. In one embodiment, ring structure 100 comprises four compressive members 110, as shown in FIG. 2. It is to be understood by those skilled in the art that ring structure 100 may comprise any number of compressive members 110. According to an aspect of the present invention, each of the compressive members 110 compressively opposes a surface of the substrate to counter or absorb stresses in the substrate 20 or package 10 during thermal cycling, testing, or operation. In one embodiment, each of the compressive members 110 is coupled to the substrate 20 and located proximal to or in the vicinity of chip 30 so that the ring structure 100 better absorbs stresses. In another embodiment, each of the compressive members 110 has a substantially concave shape to counter and/or absorb the convex shape of the substrate 20 whilst it undergoes thermal cycling.

Figure 3:
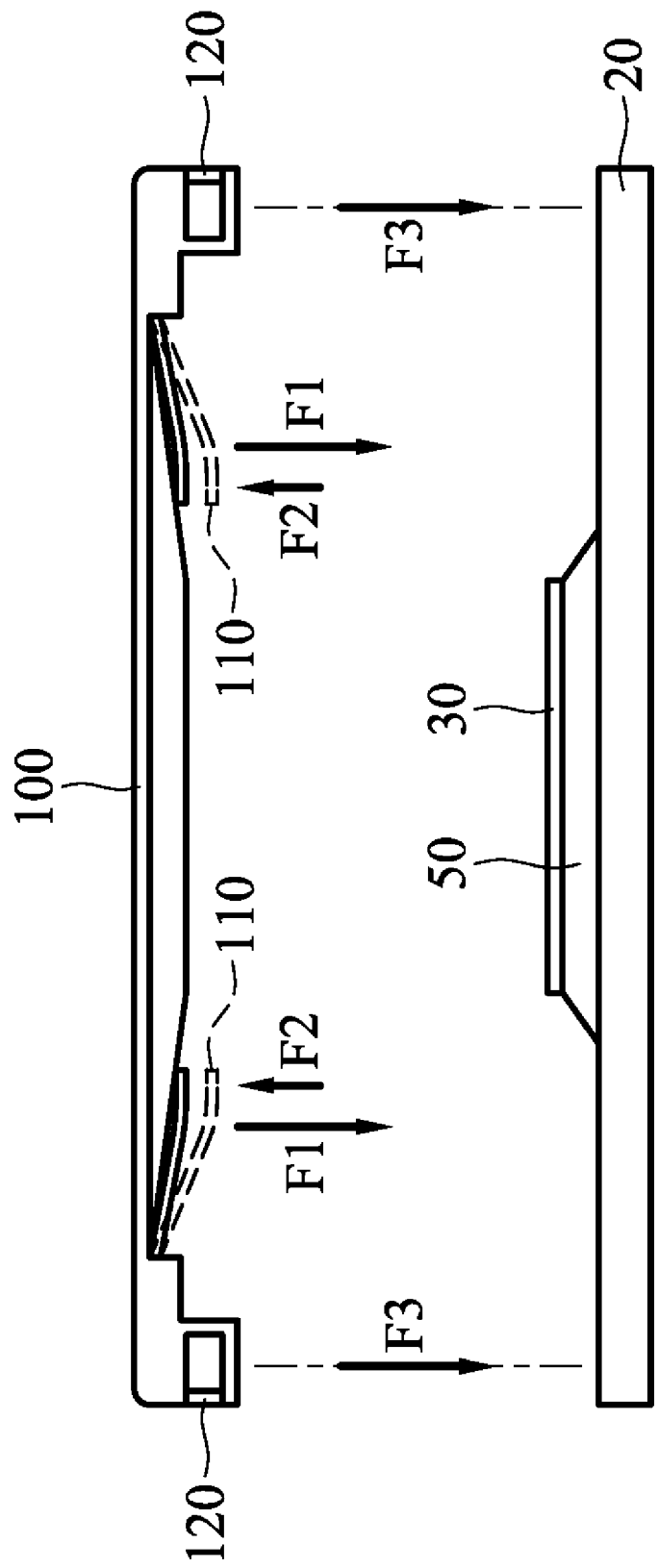
FIG. 3 is a cross-sectional view of the ring structure of FIG. 2.

In yet another embodiment, each of the compressive members 110 is a spring plate. As illustrated in FIG. 3, when ring structure 100 couples to substrate 20, a spring force F1 is exerted downwards on substrate 20 by compressive member/spring plate 110 whilst at the same time a force F2 is exerted upwards on the spring plate 110 by substrate 20. The spring plate 110 allows the force F2 to be countered and/or absorbed by the ring structure 100 or redistributed away from the chip 30 towards the stronger portions of the package 10 (e.g., the ring structure 100, substrate 20).

The compressive members 110 may have any number of shapes and sizes; however, it is understood that the compressive members 110 are so dimensioned so as to be able to counter and absorb the stresses in package 10. In one exemplary embodiment of the present invention, the compressive members 110 comprise a metal, such as copper, aluminum, or copper tungsten. In another embodiment, the compressive members 110 comprise a ceramic material. In yet another embodiment, the compressive members 110 comprise a silicon containing material. In yet another embodiment, the compressive members 110 comprise a composite alloy. In yet another embodiment, the compressive members 110 comprise a plastic material.

Figure 4:
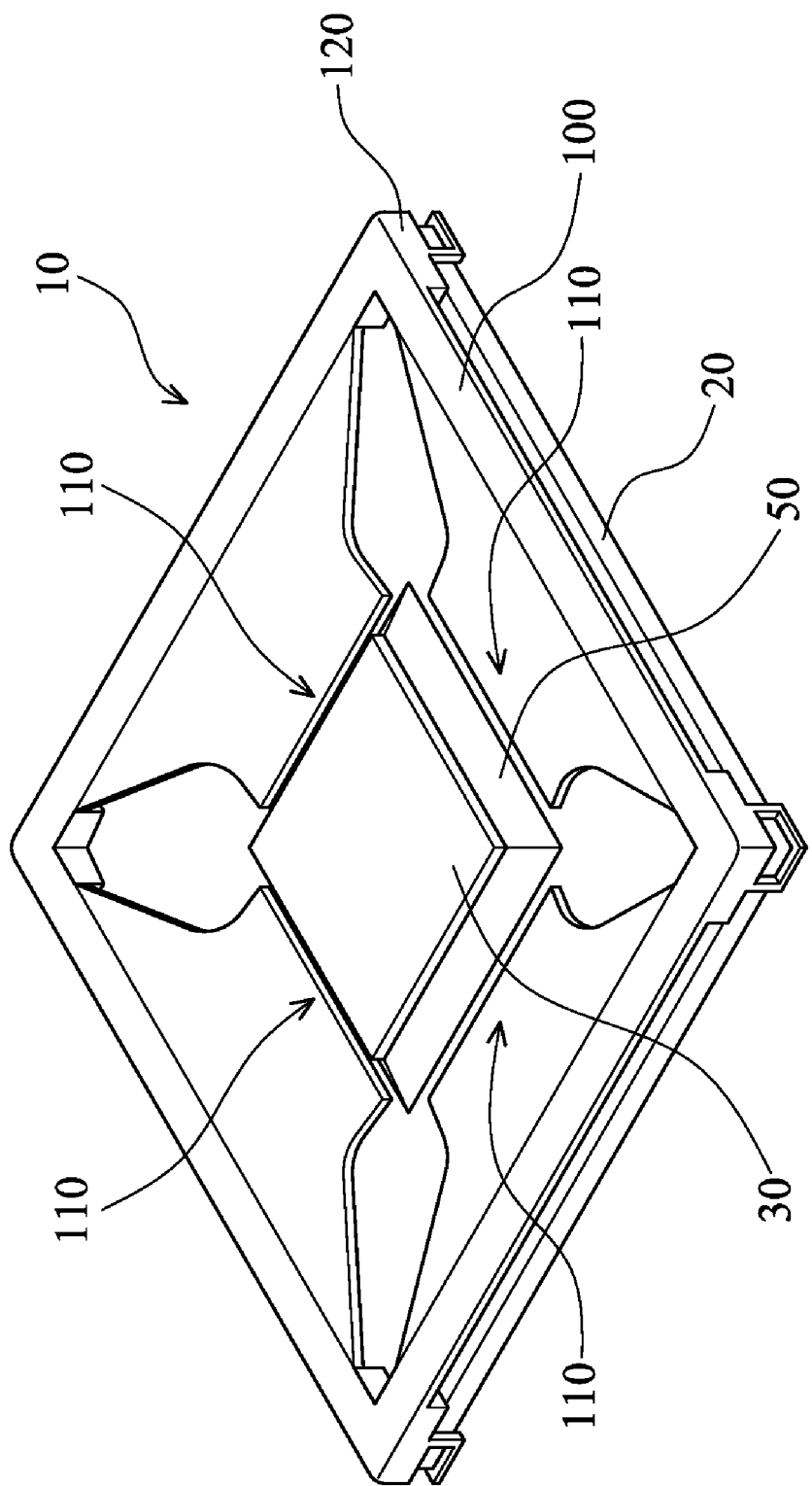
FIG. 4 is a perspective view of a chip package showing the ring structure of FIG. 2 attached to a substrate.

Still referring to FIGS. 2 and 3, the ring structure 100 further includes one or more clamping means 120 arrayed at distal ends of the ring structure 100. According to one embodiment, clamping means 120 engages a respective corner of the substrate 20 to securely clamp the ring structure 100 onto the substrate 20. According to one embodiment, the flip chip package 10, as shown in FIGS. 2 and 3 has four clamping means 120, each exerting a force F3 on a respective corner of substrate 20. The clamping means 120 may comprise of a fastener, bracket, catch, clasp, grip, hold, lock, rib, fastener, hook, latch, adhesive, epoxy, and equivalents. According to another embodiment, clamping means 120 includes a clip on respective ends of the ring structure 100, each clip having an open end through which a respective corner of the substrate 20 passes through. FIG. 4 illustrates a completed flip chip package 10 showing the ring structure 100 attached to the substrate 20.

The ring structure of the present disclosure reduces package warpage and lowers the stress that is incurred by constraints of the ring structure on the substrate. By accommodating (e.g., absorb/redistribute) the stresses of material CTE mismatches within the package, the risk of delamination and cracking of the chip, underfill, or substrate is reduced. In other words, the forces generated by the CTE mismatch are absorbed by the ring structure and/or redistributed away from the chip and toward the stronger portions of the package (e.g., ring structure, substrate). As a result, the flip chip package may be more reliably used and more reliably connected to a printed circuit board.

In the preceding detailed description, the present invention is described with reference to specifically exemplary embodiments thereof. It will, however, be evident that various modifications, structures, processes, and changes may be made thereto without departing from the broader spirit and scope of the embodiments of the present invention, as set forth in the claims. The specification and drawings are, accordingly, to be regarded as illustrative and not restrictive. It is understood that embodiments of the present invention are capable of using various other combinations and environments and are capable of changes or modifications within the scope of the inventive concept as expressed herein.

What is claimed is:
1. A semiconductor device package, comprising:
a package substrate;
a chip coupled to the package substrate; and a ring structure coupled to the package substrate and positioned laterally around the periphery of the chip so that a surface of the chip is exposed, wherein the ring structure comprises one or more compressive members, each of the one or more compressive members compressively opposed to a surface of the package substrate to counter or absorb stresses in the package substrate, and the ring structure further comprises one or more clips, each clip having an open end through which a respective corner of the package substrate passes.

2. The semiconductor device package of claim 1, wherein the compressive member is a spring plate.

3. The semiconductor device package of claim 1, wherein the compressive member is a material selected from the group consisting of metals, ceramics, silicon-containing materials, composite alloys, and plastics.

4. The semiconductor device package of claim 1, wherein the compressive member has a substantially concave surface.

5. The semiconductor device package of claim 1, wherein the one or more clips are disposed on respective ends of the ring structure.

6. The semiconductor device package of claim 1, wherein the ring structure has substantially the same coefficient of thermal expansion as the package substrate.

7. The semiconductor device package of claim 1, wherein the one or more clips are integral with the ring structure.

8. A ring structure for use in flip chip packaging having a die coupled to a package substrate, the ring structure comprising:
  a body positioned laterally around the periphery of the die so that the surface of the die is exposed; and
  one or more compressive members integral to the body, wherein each of the one or more compressive members compressively are opposed to a surface of the package substrate to counter or absorb stresses in the package substrate, and the ring structure further comprises one or more clips, each clip having an open end through which a respective corner of the package substrate passes.

9. The ring structure of claim 8, wherein the compressive member is a spring plate.

10. The ring structure of claim 8, wherein the compressive member is a material selected from the group consisting of metals, ceramics, silicon-containing materials, composite alloys, and plastics.

11. The ring structure of claim 8, wherein the compressive member has a substantially concave surface.

12. The ring structure of claim 8, wherein the one or more clips are disposed on respective ends of the ring structure.

13. The ring structure of claim 8, wherein the ring structure has substantially the same coefficient of thermal expansion as the package substrate.

14. The ring structure of claim 8, wherein the one or more clips are integral with the ring structure.

15. A method for fabricating a semiconductor package, comprising:
  providing a package substrate;
  coupling a chip to the package substrate; and
  coupling a ring structure to the package substrate, the ring structure positioned laterally around the periphery of the chip so that a surface of the chip is exposed, wherein the ring structure comprises one or more compressive members, each of the one or more compressive members compressively opposed to a surface of the package substrate to counter or absorb stresses in the package substrate.

16. The method of claim 15, wherein the compressive member is a spring plate.

17. The method of claim 15, wherein the compressive member is a material selected from the group consisting of metals, ceramics, silicon-containing materials, composite alloys, and plastics.

18. The method of claim 15, wherein the compressive member has a substantially concave surface.

19. The method of claim 15, wherein the ring structure further comprises one or more clamping means arrayed at distal ends thereof for clamping the ring structure onto the package substrate.

20. The method of claim 15, wherein the ring structure further comprises one or more clips on respective ends of the ring structure, each clip having an open end through which a respective corner of the package substrate passes therethrough.

* * * * *